United States Patent
Litty et al.

(10) Patent No.: US 9,373,714 B2
(45) Date of Patent: Jun. 21, 2016

(54) EXTENDED-DRAIN MOS TRANSISTOR IN A THIN FILM ON INSULATOR

(71) Applicant: STMicroelectronics SA, Montrouge (FR)

(72) Inventors: Antoine Litty, Grenoble (FR); Sylvie Ortolland, Saint Nazaire les Eymes (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 14/523,996

(22) Filed: Oct. 27, 2014

(65) Prior Publication Data

US 2015/0116029 A1    Apr. 30, 2015

(30) Foreign Application Priority Data

Oct. 28, 2013    (FR) ...................................... 13 60496

(51) Int. Cl.
| | | |
|---|---|---|
| H01L 29/78 | (2006.01) | |
| H01L 29/786 | (2006.01) | |
| H01L 27/12 | (2006.01) | |
| H01L 29/10 | (2006.01) | |
| H03K 17/687 | (2006.01) | |

(52) U.S. Cl.
CPC ........ *H01L 29/7824* (2013.01); *H01L 27/1203* (2013.01); *H01L 29/1079* (2013.01); *H01L 29/1087* (2013.01); *H01L 29/78624* (2013.01); *H01L 29/78648* (2013.01); *H03K 17/687* (2013.01)

(58) Field of Classification Search
CPC ............ H01L 29/7816; H01L 29/7801; H01L 29/66659; H01L 29/66674; H01L 29/66681; H01L 29/7824; H01L 27/1203; H01L 29/66689
See application file for complete search history.

(56) References Cited

U.S. PATENT DOCUMENTS

| | | | |
|---|---|---|---|
| 5,138,409 A | 8/1992 | Kawai | |
| 8,921,186 B2 * | 12/2014 | Shea | ................... H01L 29/1095 438/286 |
| 2007/0080395 A1 | 4/2007 | Wahl et al. | |
| 2010/0258801 A1 | 10/2010 | Weyers et al. | |
| 2013/0320485 A1* | 12/2013 | Ching Tee | ........... H01L 29/7394 257/507 |

FOREIGN PATENT DOCUMENTS

EP    0444712 A1    9/1991

OTHER PUBLICATIONS

INPI Search Report and Written Opinion for FR 1360496 dated Jun. 18, 2014 (6 pages).
Bon, O., et al: "High Voltage Devices Added to a 0.13 μm High Resistivity Thin SOI CMOS Process for Mixed Analog-RF Circuits," 2005 IEEE International SOI Conference (pp. 171-173).

* cited by examiner

*Primary Examiner* — Jose R Diaz
(74) *Attorney, Agent, or Firm* — Gardere Wynne Sewell LLP (57) ABSTRACT

An extended-drain transistor is formed in a semiconductor layer arranged on one side of an insulating layer with a semiconductor region being arranged on the other side of the insulating layer. The semiconductor region includes a first portion of a first conductivity type arranged in front of the source and at least one larger portion of the gate and a second portion of a second conductivity type arranged in front of at least the larger portion of the extended drain region, each of the first and second portions being coupled to a connection pad.

24 Claims, 6 Drawing Sheets

EXTENDED-DRAIN MOS TRANSISTOR IN A THIN FILM ON INSULATOR

PRIORITY CLAIM

This application claims the priority benefit of French Patent application number 1360496, filed on Oct. 28, 2013, the contents of which is hereby incorporated by reference in its entirety to the maximum extent allowable by law.

TECHNICAL FIELD

The present disclosure relates to an extended-drain MOS transistor, and more particularly to such a transistor formed in a thin semiconductor layer formed on an insulating layer having, on its other side, a semiconductor region connectable to a bias voltage.

BACKGROUND

A study on extended-drain MOS transistors in SOI technology has been published by Maryline Bawedin et al. in Solid-State Electronics 2004, pp. 2263-2270, under title "LDMOS in SOI Technology With Very-Thin Silicon film" (hereby incorporated by reference).

Figure 1:
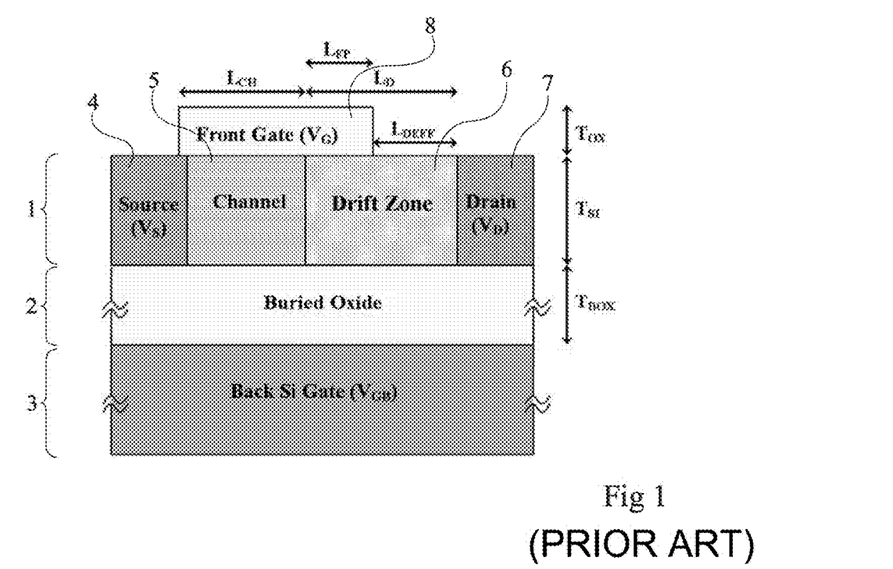
FIGS. 1 and 2, previously described, respectively correspond to FIGS. 1 and 9 of Maryline Bawedin et al.'s above-mentioned article.

FIG. 1 is a copy of FIG. 1 of the above-referenced article. It shows an extended-drain MOS transistor formed in a thin silicon layer 1 positioned on a thin buried oxide layer 2, itself positioned on a silicon substrate 3. The MOS transistor comprises a heavily-doped N-type source region 4 ($N^+$), a lightly-doped P-type channel-forming region 5 ($P^-$), an N-type doped drain extension region (Drift Zone) 6, and a heavily-doped N-type drain region 7 ($N^+$). The channel-forming region and an adjacent portion of the drift zone are covered with a gate (Front Gate) 8. In the drawing, only the gate insulator is shown. The silicon substrate is used as a back gate (Back Si Gate). The advantage of such an extended-drain MOS transistor is that it enables to withstand higher voltages than what is allowed by conventional MOS transistors of same technology. For example, in a technology where conventional MOS transistors are adapted to power supply voltages in the order of 2 volts, the extended-drain MOS transistor may withstand voltages greater than 5 volts.

Figure 2:
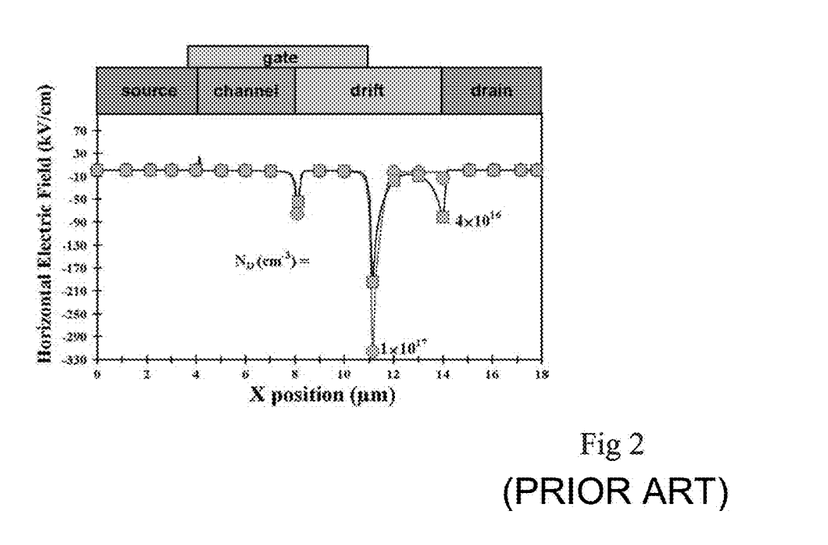

The authors of the article demonstrate in their FIG. 9, copied in FIG. 2 of the present disclosure, the horizontal electric field distribution in volt/cm according to the position (X) in the horizontal direction. Three field peaks can be observed, the first one at the limit between the channel and the drift zone, the second one at the limit of the gate above the drift zone, and the third one at the limit between the drift zone and the drain. In this drawing, circles show the horizontal electric field distribution for a first doping level ($10^{17}$ at./cm$^3$) of the drift zone and squares show the field distribution for a second doping level ($4.10^{16}$ at./cm$^3$) of the drift zone.

Further, generally, an extended-drain transistor has the advantage of having a higher breakdown voltage than a transistor with no extended drain, of same technology, but has the disadvantage of having a greater conduction resistance ($R_{on}$) due to the current flow in the medium-doped drift zone.

SUMMARY

According to an embodiment, an extended-drain transistor manufactured in a thin semiconductor-on-insulator layer, such that the breakdown voltage is made as high as possible and that the conduction resistance is made as low as possible, is obtained.

Thus, an embodiment provides an extended-drain transistor formed in a semiconductor layer arranged on one side of an insulating layer, a semiconductor region being arranged on the other side of the insulating layer, the semiconductor region comprising a first portion of a first conductivity type arranged in front of the source and at least one larger portion of the gate and a second portion of a second conductivity type arranged in front of at least the larger portion of the extended drain region, each of the first and second portions being coupled to a connection pad.

According to an embodiment, the transistor is of silicon-on-insulator type.

According to an embodiment, the transistor is of N-channel type, the first portion is of type P, and the second portion is of type N.

According to an embodiment, the limit between the first and second portion is located under the extended drain region, but not under the gate.

According to an embodiment, the first P-type portion is biased to a negative or zero voltage and the second N-type portion is biased to a positive or zero voltage in order to maintain the junction reverse biased.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

For clarity, the same elements have been designated with the same reference numerals in the various drawings and, further, as usual in the representation of integrated circuits, the various drawings are not to scale.

Here, "thin" semiconductor layer designates a layer having a thickness below 20 nm under the gate; the semiconductor layer can be thicker in the ungated area (i.e., the area not under the gate) referred to as the drift zone, for example, with a thickness of about 25 nm; and "thin" insulating layer designates a layer such that a conductive layer arranged behind this layer has an effect upon a thin semiconductor layer arranged on the other side of this insulating layer. Such a "thin" insulating layer preferably has a thickness below 50 nm.

Figure 3:
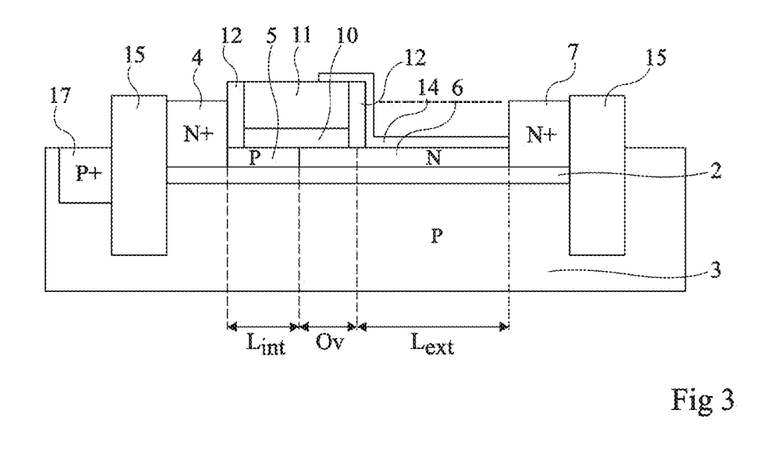
FIG. 3 shows an extended-drain transistor similar to that previously described, in a specific technology.

In FIG. 3, the same elements as in FIG. 1 are designated with the same reference numerals. Thus, the transistor of FIG. 3 is formed in a thin silicon layer positioned on an insulating layer 2 positioned on a silicon substrate 3. The extended-drain MOS transistor comprises an N+-type source region 4, a P-type intrinsic or doped channel-forming region 5, an N-type drain extension region (drift) 6, and an N+-type drain region 7. The fact that the gate comprises a gate insulator 10 and a conductive gate region 11 which may be polysilicon, a metal, or a stack of conductive materials has been illustrated. The gate is laterally surrounded with insulating spacers 12. The drift zone is covered with an insulating layer 14. The transistor is generally surrounded with insulating walls 15 penetrating into substrate 3. Reference numeral 17 designates a substrate contact P+ terminal or region, the substrate being itself P-type doped. $L_{int}$ designates the length of the channel-forming region, Ov (Overlap) designates the length along which the gate covers the drain extension region, and $L_{ext}$ designates the length of the drift zone beyond the gate limit.

As an example, the thin semiconductor layer where the transistor is formed has a thickness in the range from 5 to 12 nm, and insulating layer 2 has a thickness from 10 to 30 nm. For example, length $L_{int}$ is in the range from 70 to 200 nm, value Ov is in the range from 0 to 300 nm, and value $L_{ext}$ is in the range from 100 to 400 nm. The case where the doping levels are in the range from $10^{15}$ to $10^{17}$ atoms/cm$^3$ for channel-forming region 5 and in the range from $10^{15}$ to $10^{19}$ atoms/cm$^3$ for drift zone 6 is further considered.

The drift region 6 may, in an embodiment, have a thickness substantially equal to the thickness in the channel region 5. In an alternative embodiment, the drift region 6 may instead be thicker than the channel region 5, for example, having a thickness substantially equal to the thickness of the drain region 7 (see, dotted line in FIG. 3). In this alternative embodiment, the layer 14 would still overlie the drift region 6.

Figure 4:
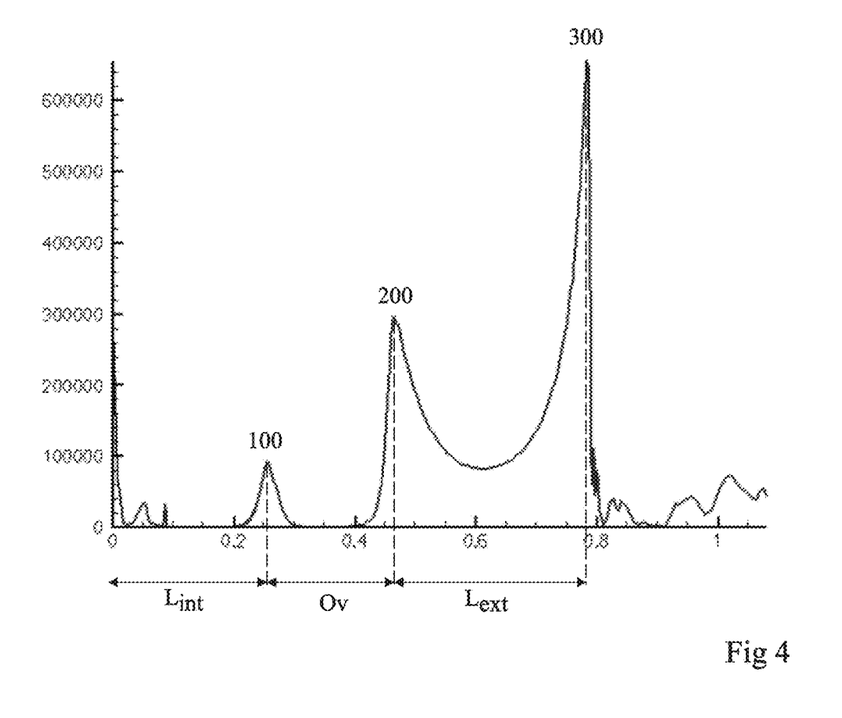
FIG. 4 shows the shape of the horizontal electric field in a MOS transistor of the type in FIG. 3.

FIG. 4 shows the shape of the horizontal electric field in thin silicon layer 5, 6 in the case where the gate, the source, and the substrate are at a zero potential and the drain is at a potential from 5 to 6 volts. Values Ov and $L_{ext}$ appearing in FIG. 3 have been shown in the drawing. Three horizontal field peaks appear, a first peak 100 at the interface between channel-forming region 5 and drift zone 6, a second peak 200 at the projection of the gate limit on the drain side, and a third peak 300 at the interface between lightly-doped extension region 6 and drain contacting region 7.

By applying a positive biasing to the substrate from terminal 17, the apparent resistance of drift zone 6 is decreased. The threshold voltage Vth decreases, consequently the leakage current increases and leads to a reduction of the breakdown voltage $V_{BR}$.

Figure 5:
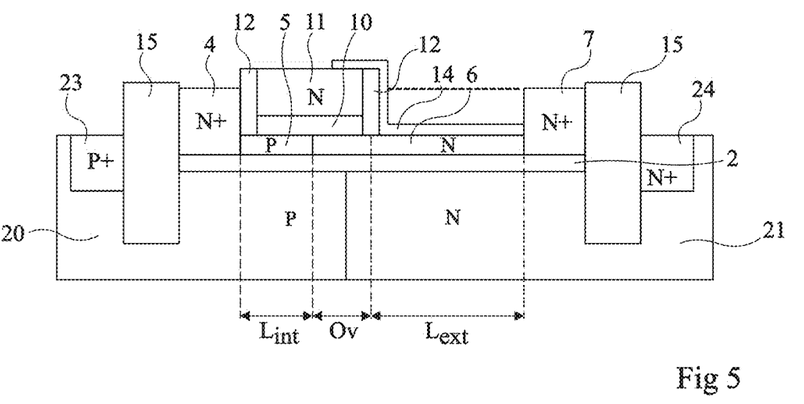
FIGS. 5 and 6 show two embodiments of an extended-drain MOS transistor.
Figure 6:
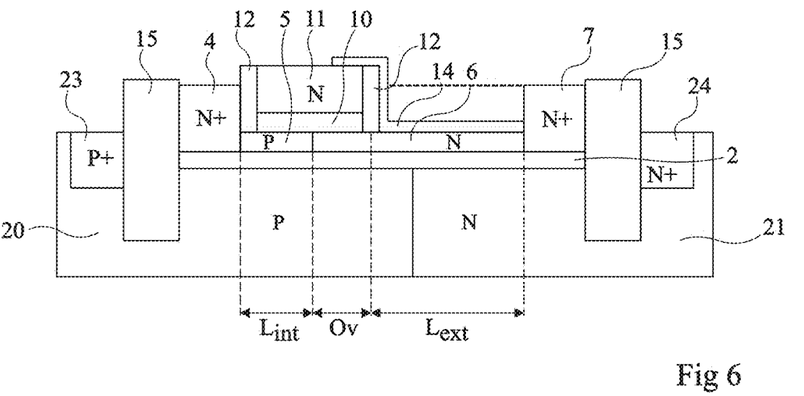

FIGS. 5 and 6 show two alternative embodiments of an extended-drain MOS transistor.

In these two embodiments, the same elements as in FIG. 3 are designated with the same reference numerals. The main difference between the transistors of FIGS. 5 to 6 and the transistor of FIG. 3 is that in FIGS. 5 and 6, the substrate (or an upper portion of the substrate) is divided in two regions: a P-type region 20 on the left-hand side of the drawing and an N-type region 21 on the right-hand side of the drawing. FIGS. 5 and 6 differ from each other by the location of the limit between P-type region 20 and N-type region 21. Each of regions 20 and 21 is associated with a bias terminal, respectively a P+ region 23 to contact P region 20 and an N+ region 24 to contact N region 21. In the embodiment of FIG. 5, this limit is located beyond the border between the projection of the gate and the extended drain on the drain side. In the embodiment of FIG. 6, this limit is located in a substantially median portion of the extended drain region, but it may be shifted to the right or to the left of this median position. The electrostatic behavior of the channel and the equivalent resistivity of the extended drain region can thus be controlled independently.

Experiments performed by the inventors show that the embodiment of FIG. 5 enables to considerably decrease the equivalent resistivity of the drain extension region, that is, the $R_{on}$, due to the influence that back gate 21 may have on a major portion of drift zone 6. However, the embodiment of FIG. 5, as will be seen hereafter, unequally affects the values of the horizontal electric field peaks at the various above-mentioned interfaces. The embodiment of FIG. 6 does not decrease the $R_{on}$ as much, but is more efficient on the attenuation of horizontal electric field peaks, that is, on the increase of breakdown voltage $V_{BR}$. Thus, the provision of a double ground plane or double back gate enables to improve the breakdown voltage, that is, the reliability of the device, and enables to decrease the $R_{on}$ per transistor surface area unit when the two back gates are properly biased. Further, as indicated, the compromise between decreasing the $R_{on}$ and increasing the breakdown voltage may be chosen.

Figure 7:
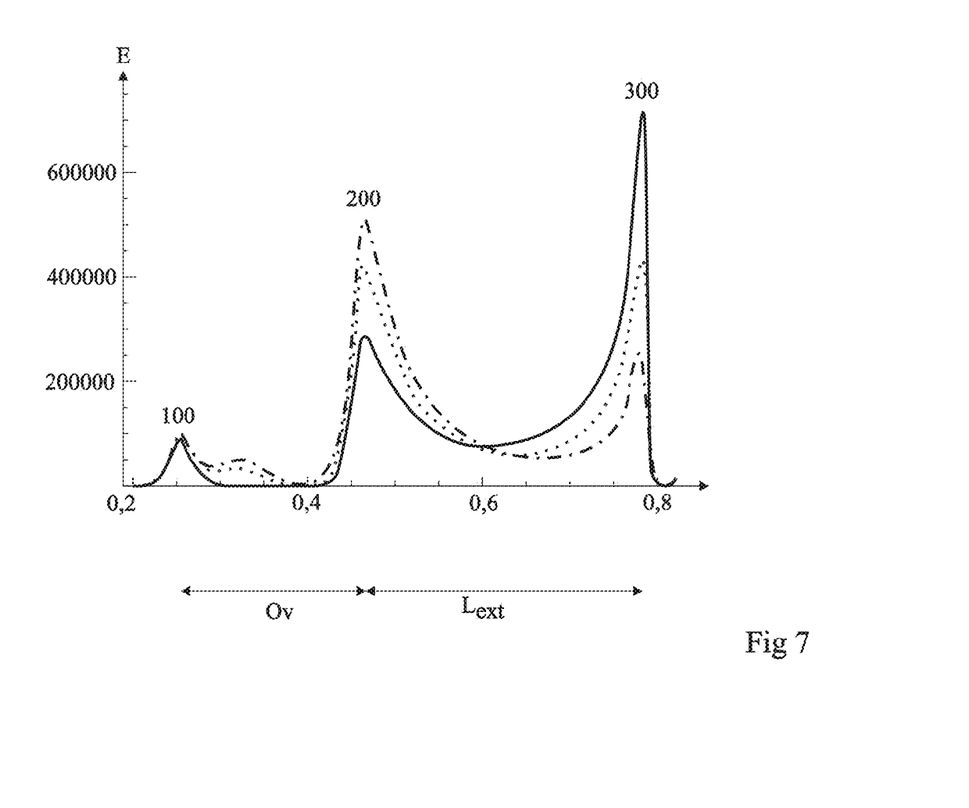
FIG. 7 shows the shape of the horizontal electric field for various different back gate biasing values and for a transistor of the type in FIG. 5.

FIG. 7 shows the shape of the horizontal electric field for various different back gate biasing values and for a transistor of the type in FIG. 5.

The curve in full line corresponds to the case of prior art with a single back gate, this gate being biased to 0 V.

The curve in dotted line correspond to the case where P-type back gate 20 is biased to 0 volt and where N-type back gate 21 is biased to 1 volt.

The curve in stripe-dot line correspond to the case where P-type back gate 20 is biased to 0 volt and where N-type back gate 21 is biased to 2 volts.

It can be seen that, in the last two cases, the intensity of peak 300 located at the interface between the extension region and the drain contact region is decreased, but that the intensity of peak 200 located at the gate limit increases. The transistor breakdown voltage is thus not improved. Measurements on the value of $R_{on}$ show that, in the last two cases, the conduction resistance per surface area unit is decreased by from approximately 30 to 60% with respect to the case where a single back gate is used. This improvement of $R_{on}$ is obtained without significantly affecting threshold voltage $V_T$ of the transistors.

Figure 8:
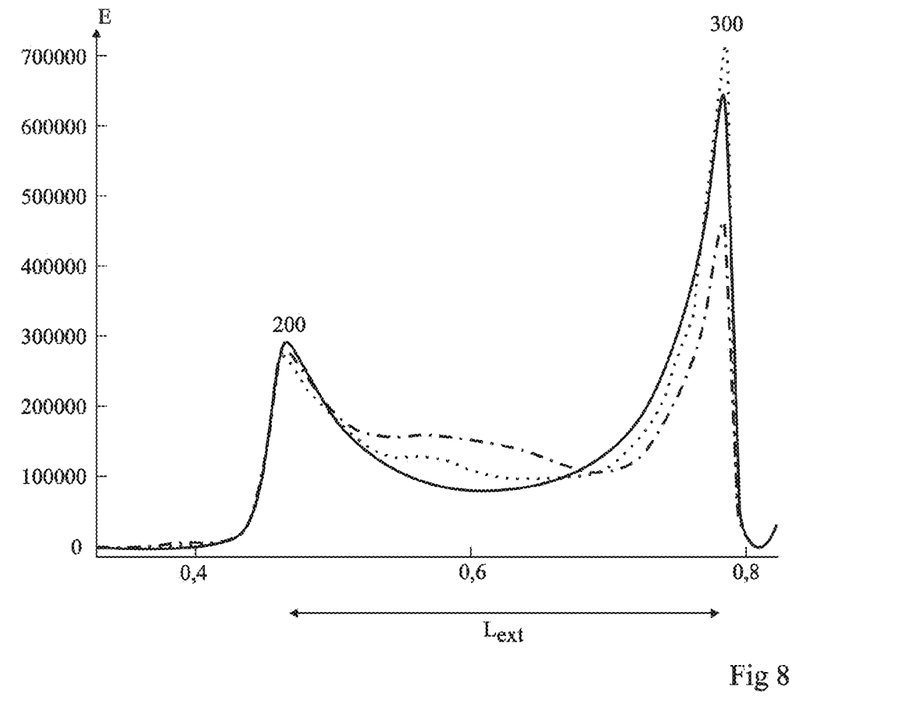
FIG. 8 shows the shape of the horizontal electric field for various different back gate biasing values and for a transistor of the type in FIG. 6.

FIG. 8 illustrates a horizontal electric field characteristic according to the position along the drift zone $L_{ext}$ for various biasings of P region 20 and N region 21. This drawing concerns the case of a structure of the type in FIG. 6.

The curve in full line corresponds to the case of prior art with a single back gate, this gate being biased to 0 V.

The curve in dotted line corresponds to the case where a same 0-V biasing is applied to back gates 20 and 21.

The curve in stripe-dot line corresponds to the case where P-type back gate 20 is biased to 0 volt and where N-type back gate 21 is biased to 1 volt. It can be seen that, in this last case, the peak located at the interface between the extension region and the drain contacting region has been considerably decreased and that the transistor breakdown voltage has thus been increased. If a 2-V voltage is applied to gate 21, an additional decrease of peak 300 can be observed.

Figure 9:
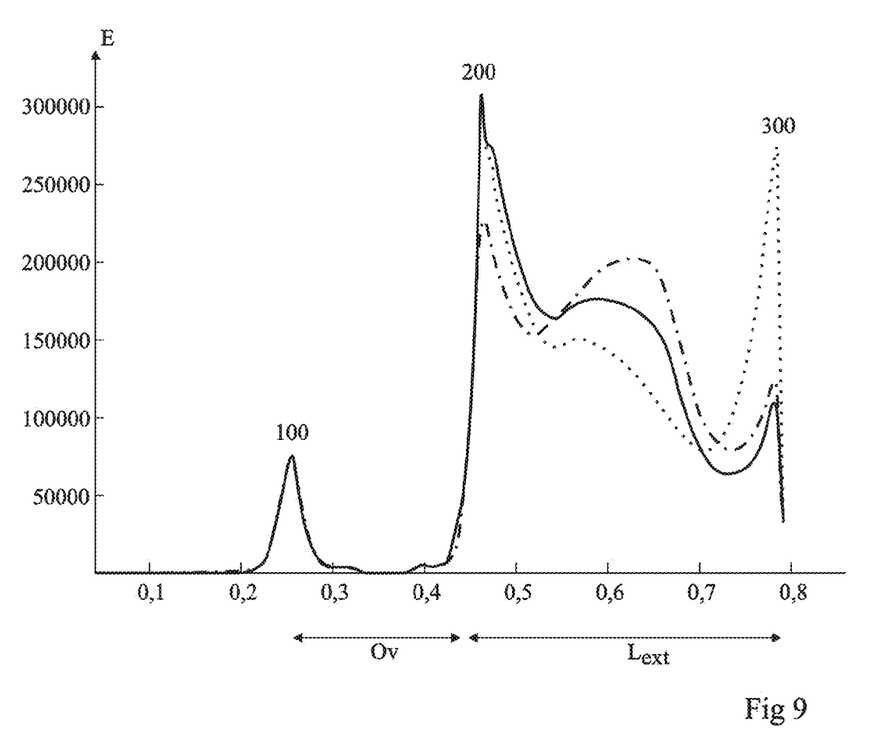
FIG. 9 shows the shape of the horizontal electric field for various different back gate biasing values and for a transistor of the type in FIG. 6.

FIG. 9 also shows three curves of the horizontal electric field according to distance. This drawing concerns the case of a structure of the type in FIG. 6.

The curve in dotted line corresponds to the case where N-type back gate 21 is biased to 1 volt and where P-type back gate 20 is biased to 0 volt.

The curve in full line corresponds to the case where N-type back gate 21 is biased to 2 volts and where P-type back gate 20 is biased to 0 volt.

The curve in stripe-dot line corresponds to the case where N-type back gate 21 is biased to 2 volts and where P-type back gate 20 is biased to −1 volt. It can be seen that then, for this last choice of values, the two horizontal electric field peaks have been considerably decreased, which provides an improved breakdown voltage for the device.

Measurements of the value of $R_{on}$ show that, for a structure of the type in FIG. 6, when proper biasings are applied to the back gates, the conduction resistance per surface area unit is decreased with respect to the case where a single back gate is used. This improvement of $R_{on}$ can be obtained without affecting threshold voltage $V_T$ of the transistors. The threshold voltage is influenced by the P-type back bias, located at source side under the channel opposite the drift zone.

The present invention is likely to have various alterations, modifications, and improvements, which will readily occur to those skilled in the art. In particular, the entire above disclosure has been made in the case of a structure of silicon-on-insulator type. It should be noted that the invention also applies to FINFET structures where a thin silicon film is placed against an insulator, itself placed against a substrate-forming region, the structure being vertical with respect to the main plane of a silicon wafer.

Examples where the semiconductor of the thin film having the transistor formed therein is silicon have been described herein. Other semiconductors may be used, for example, SiGe.

Examples where the transistors have N channels have been described herein. The present description applies to the case of P-channel transistors, the conductivity types and the biasings being then inverted.

In an embodiment, the source side region is connected to the body by body contacts (P+ implant) to prevent from floating effect. See, for example, the structure as disclosed by Bon, et al., "High Voltage Devices Added to a 0.13 μm High Resistivity Thin SOI CMOS Process for Mixed Analog-RF Circuits" 2005 IEEEE International SOI Conference, pg. 171 (incorporated by reference).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An extended-drain transistor, comprising:
a thin semiconductor layer arranged on one side of a thin insulating layer and supporting source, drain and channel regions for the transistor,
a semiconductor region arranged on the other side of the insulating layer,
wherein the semiconductor region comprises:
   a first portion of a first conductivity type arranged below the source region of the transistor and below at least a portion of a gate of the transistor, and
   a second portion of a second conductivity type arranged adjacent the first portion and below an extended drain of the drain region; and
   first and second electrical contacts to the first and second portions, respectively, said first electrical contact comprising a third portion of the first conductivity type more highly doped than the first portion and said second electrical contact comprising a fourth portion of the second conductivity type more highly doped than the second portion.

2. The transistor of claim 1, wherein the semiconductor layer, insulating layer and semiconductor region form a substrate of silicon-on-insulator type.

3. The transistor of claim 1, wherein the transistor is an N-channel device, and wherein the first portion is of P-type and the second portion is of N-type.

4. The transistor of claim 1, wherein a vertical junction between the first and second portions is located below the extended drain but not under the gate.

5. The transistor claim 1, wherein the first portion is biased through the third portion to a negative or zero voltage while the second portion is simultaneously biased to a positive or zero voltage.

6. The transistor of claim 1, wherein a vertical junction between the first and second portions is located below the gate.

7. The transistor of claim 1, wherein the drain region of the thin semiconductor layer includes a portion underneath the gate.

8. The transistor of claim 7, wherein said extended drain has a thickness which is greater than a thickness of the portion of the drain region underneath the gate.

9. An integrated circuit transistor, comprising:
a first semiconductor layer;
a second semiconductor layer;
an insulating layer between the first and second semiconductor layers;
an insulating wall surrounding the first semiconductor layer, the insulting wall penetrating partially into the second semiconductor layer;
a contact made to the second semiconductor layer;
wherein the first semiconductor layer comprises a source region, a channel region adjacent the source region, a drain extension region adjacent the channel region and a drain region adjacent the drain extension region;
a gate oxide layer over the channel region and extending at least partially over the drain extension region;
a gate electrode over the gate oxide layer;
wherein the second semiconductor layer is of mixed conductivity type including a first region of a first conductivity type positioned underneath the source and channel regions and a second region of a second conductivity type positioned underneath the drain and an adjacent portion of the drain extension region.

10. The transistor of claim 9, wherein the drain extension region includes an overlap region located under the gate electrode.

11. The transistor of claim 9, wherein a division between the first region of the first conductivity type and the second region of the second conductivity type is aligned within the overlap region.

12. The transistor of claim 9, wherein a division between the first region of the first conductivity type and the second region of the second conductivity type is aligned outside the overlap region.

13. The transistor of claim 9, wherein the source region is of the second conductivity type, the channel region is of the first conductivity type, the drain extension region is of the second conductivity type and the drain region is of the second conductivity type.

14. The transistor of claim 9, further comprising an insulating layer covering a portion of the drain extension region not covered by the gate oxide layer.

15. The transistor of claim 9, wherein the second semiconductor layer is positively biased through the contact so as to reduce a resistance of the drain extension region.

16. The transistor of claim 9, wherein the channel region and the drain extension region have a same thickness.

17. The transistor of claim 9, wherein the channel region has a first thickness and at least a portion of the drain extension region outside of the gate has a second thickness which is thicker than the first thickness.

18. The transistor claim 1, wherein the first portion is biased through the third portion to a first voltage while and the second portion is simultaneously biased to second voltage different from the first voltage, wherein the first voltage is less than the second voltage.

19. The transistor of claim 1, wherein the semiconductor region has a first surface in contact with the insulating layer and an opposed second surface, and wherein the first and second portions both have thicknesses extending from the first surface to the second surface.

20. An extended-drain transistor, comprising:
a thin semiconductor layer;
a thick semiconductor layer;
an insulating layer positioned between the thin and thick semiconductor layers;
wherein the thin semiconductor layer includes a source region of a first conductivity type, a drain region of the first conductivity type, a channel region of a second conductivity type and a drain extension region between the channel region and the drain region;
wherein the thick semiconductor layer is of mixed conductivity type including:
a first region of the second conductivity type positioned underneath the source and channel regions;
a second region of the first conductivity type positioned underneath the drain region and the drain extension region;
a third region of the second conductivity type within and more highly doped than the first region and forming an electric contact to first region; and
a fourth region of the first conductivity type within and more highly doped than the second region and forming an electric contact to the second region.

21. The transistor of claim 20, wherein the thick substrate has a first surface in contact with the insulating layer and an opposed second surface, and wherein the first and second regions both have thicknesses extending from the first surface to the second surface.

22. The transistor of claim 20, further comprising a gate electrode, and wherein a vertical junction between the first and second regions is located below the extended drain but not under the gate electrode.

23. The transistor of claim 20, further comprising a gate electrode, and wherein a vertical junction between the first and second portions is located below the extended drain and under the gate electrode.

24. The transistor claim 20, wherein the electric contact formed by the third region applies a first bias voltage to the first region, and wherein the electric contact formed by the fourth region applies a second bias voltage to the second region, wherein the first bias voltage is less than the second bias voltage.

* * * * *